US009571721B2

(12) United States Patent
Kitano (10) Patent No.: US 9,571,721 B2
(45) Date of Patent: Feb. 14, 2017

(54) SOLID-STATE IMAGING DEVICE AND ELECTRONIC APPARATUS

(71) Applicant: SONY CORPORATION, Tokyo (JP)

(72) Inventor: Yoshiaki Kitano, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/916,160

(22) PCT Filed: Jun. 23, 2015

(86) PCT No.: PCT/JP2015/067980
§ 371 (c)(1),
(2) Date: Mar. 2, 2016

(87) PCT Pub. No.: WO2016/002575
PCT Pub. Date: Jan. 7, 2016

(65) Prior Publication Data
US 2016/0198083 A1 Jul. 7, 2016

(30) Foreign Application Priority Data

Jul. 3, 2014 (JP) ................................. 2014-137437

(51) Int. Cl.
*H04N 5/225* (2006.01)
*H04N 5/232* (2006.01)
*G02B 7/34* (2006.01)
*G02B 6/00* (2006.01)
*H04N 5/369* (2011.01)
(Continued)

(52) U.S. Cl.
CPC ............ *H04N 5/23212* (2013.01); *G02B 6/00* (2013.01); *G02B 7/34* (2013.01); *G02B 13/0085* (2013.01); *G03B 11/00* (2013.01);

*H01L 27/14623* (2013.01); *H01L 27/14627* (2013.01); *H01L 27/14641* (2013.01); *H01L 27/14643* (2013.01);
(Continued)

(58) Field of Classification Search
CPC ............................. H04N 5/23212; G02B 6/00
USPC ........................................................ 348/340
See application file for complete search history.

(56) References Cited

U.S. PATENT DOCUMENTS

| | | | | |
|---|---|---|---|---|
| 2010/0230578 A1* | 9/2010 | Horikoshi | ......... | H01L 27/14625 250/208.1 |
| 2015/0228687 A1* | 8/2015 | Numata | ............ | H01L 27/14627 257/432 |
| 2016/0049439 A1* | 2/2016 | Yanagita | ........... | H01L 27/14623 257/432 |

FOREIGN PATENT DOCUMENTS

| | | |
|---|---|---|
| JP | 2008-071972 A | 3/2008 |
| JP | 2010-199299 A | 9/2010 |

(Continued)

*Primary Examiner* — Usman Khan
(74) *Attorney, Agent, or Firm* — Chip Law Group (57) ABSTRACT

An imaging apparatus, for example, a solid-state imaging device, includes a phase difference pixel, and an electronic apparatus that optimizes the optical properties (pupil separation performance) of the phase difference pixel, and the optical properties (light sensitivity) of a standard pixel. The solid-state imaging device includes a standard pixel and a phase difference pixel. The standard pixel includes a first optical waveguide that guides incident light to a light receiving region. The phase difference pixel includes a second optical waveguide that guides incident light to the light receiving region, and a first light shielding film provided on the upper layer side of the second optical waveguide. The upper end of the first optical waveguide of the (Continued)

standard pixel and the upper end of the second optical waveguide of the phase difference pixel are located at different heights.

13 Claims, 12 Drawing Sheets (51) Int. Cl.
    *H04N 5/374*     (2011.01)
    *G03B 11/00*     (2006.01)
    *H04N 5/238*     (2006.01)
    *G02B 13/00*     (2006.01)
    *H01L 27/146*     (2006.01)

(52) U.S. Cl.
    CPC .............. *H04N 5/238* (2013.01); *H04N 5/369* (2013.01); *H04N 5/374* (2013.01)

(56) References Cited

FOREIGN PATENT DOCUMENTS

| JP | 2011-029379 A | 2/2011 |
|----|---------------|--------|
| JP | 2011-029932 A | 2/2011 |
| JP | 2011-243753 A | 12/2011 |
| JP | 2012-004437 A | 1/2012 |
| JP | 2012-064709 A | 3/2012 |
| JP | 2012-114882 A | 6/2012 |
| JP | 2012-151215 A | 8/2012 |
| WO | 2012-066846 A | 5/2012 |
| WO | 2012/066846 A | 5/2012 |

* cited by examiner

SOLID-STATE IMAGING DEVICE AND ELECTRONIC APPARATUS

TECHNICAL FIELD

The present disclosure relates to solid-state imaging devices and electronic apparatuses, and more particularly, to a solid-state imaging device that preferably includes regular pixels for obtaining pixel signals and phase difference pixels for realizing an image surface phase difference Auto-Focus (AF) function, and an electronic apparatus.

BACKGROUND ART

As a method of AF, an image surface phase difference AF has been known. In a solid-state imaging device that realizes image surface phase difference AF, phase difference pixels for dividing incident light for pupils are provided in predetermined positions, as well as regular pixels for obtaining pixel signals.

Figure 1:
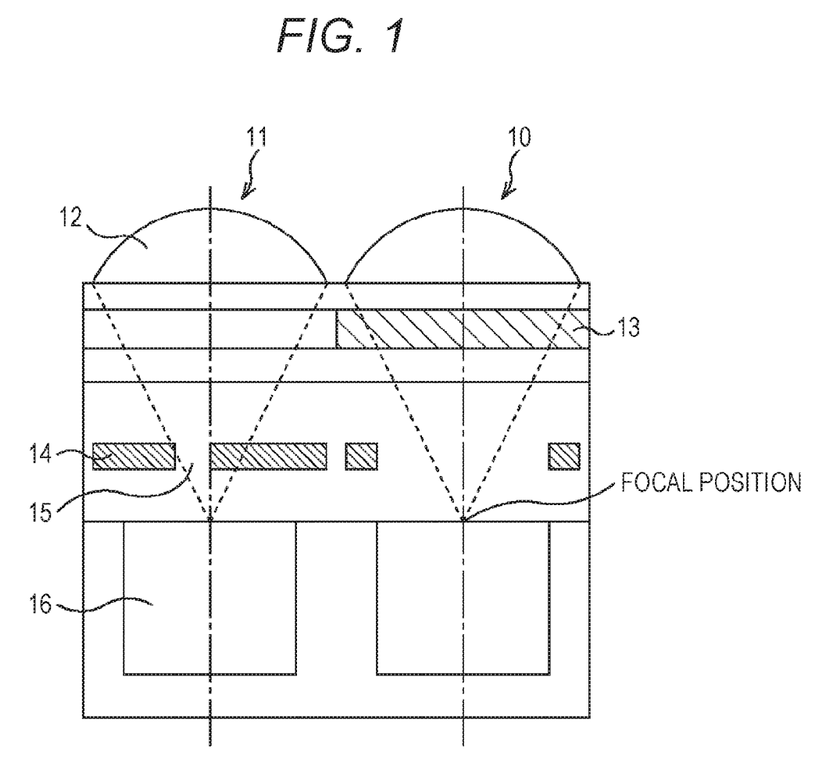
FIG. 1 is a block diagram showing an example structure of a solid-state imaging device including a conventional phase difference pixel.

FIG. 1 is a cross-sectional view of an example structure of a solid-state imaging device including a conventional phase difference pixel. In the drawing, the right side is a standard pixel 10, and the left side is a phase difference pixel 11.

In this solid-state imaging device, the standard pixel 10 and the phase difference pixel 11 each have an on-chip lens 12, a color filter 13, and a light receiving region 16, in this order from the upper layer side (the light incidence surface side).

A light shielding film 14 that has an aperture portion 15 having an aperture deviated from the optical axis of the on-chip lens 12 is also provided in the phase difference pixel 11, but is not provided in the standard pixel 10.

In the drawing, the on-chip lenses 12 of the standard pixel 10 and the phase difference pixel 11 have identical shapes, and are designed so that the focal positions are adjusted to the surfaces of the light receiving regions 16 (in other words, incident light fluxes are gathered on the surfaces of the light receiving regions 16). In this case, optimum optical properties of the standard pixel 10 can be achieved. As for the phase difference pixel 11, however, the sensitivity for incident light from oblique directions becomes lower due to the existence of the light shielding film 14, and the pupil separation performance is degraded, for example.

So as to prevent degradation of the separation performance of the phase difference pixel 11, the shape of the on-chip lens 12 should be adjusted so that the focal position is located at the height of the light shielding film 14. In that case, however, the optimum optical properties of the standard pixel 10 are of course not achieved.

In view of this, a structure that prevents degradation of the optical properties of the standard pixel 10 while maintaining the separation performance of the phase difference pixel 11 has been suggested (see Patent Document 1, for example).

Figure 2:
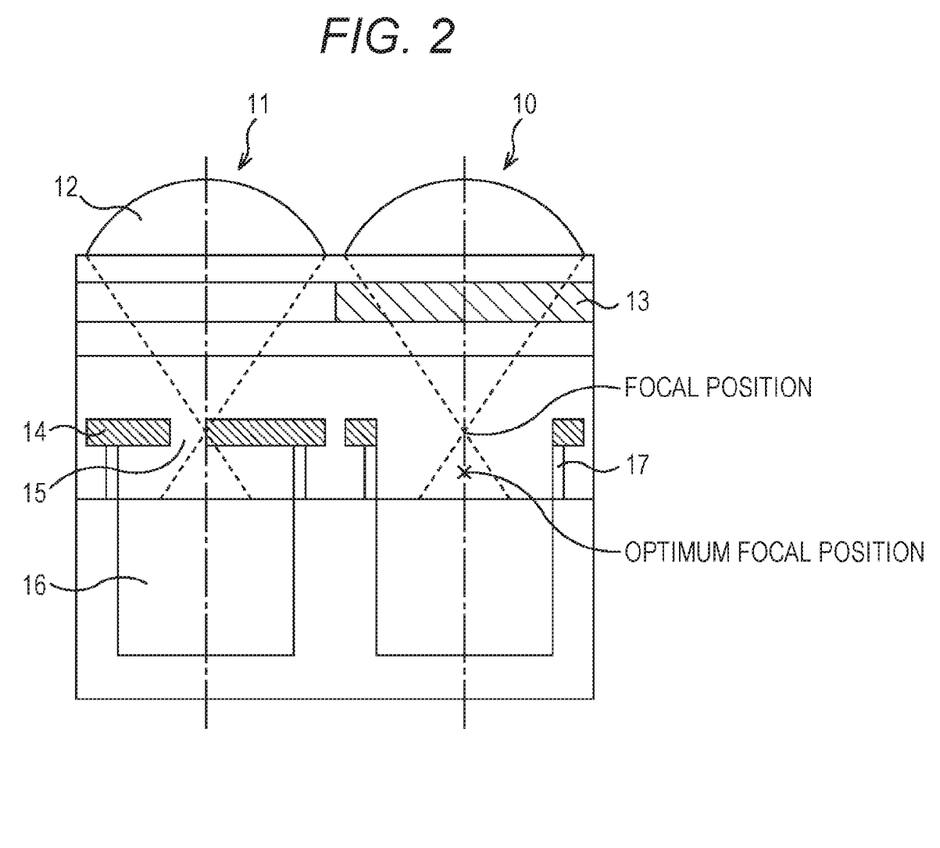
FIG. 2 is a block diagram showing another example structure of a solid-state imaging device including a conventional phase difference pixel.

FIG. 2 is a cross-sectional view of an example of such a structure. This example structure differs from the structure shown in FIG. 1 in that the focal positions of the on-chip lenses 12 are located at the height of the light shielding film 14, and optical waveguides 17 are additionally provided on the lower layer side of the light shielding film 14.

CITATION LIST

Patent Document

Patent Document 1: Japanese Patent Application Laid-Open No. 2011-29932

SUMMARY OF THE INVENTION

Problems to Be Solved by the Invention

With the example structure shown in FIG. 2, incident light can be readily guided to the light receiving regions 16 by the optical waveguides 17. Accordingly, degradation of the optical properties of the standard pixel 10 can be reduced.

However, in the state where the optical waveguides 17 are provided, the optimum focal position of the standard pixel 10 is not necessarily located at the height of the light shielding film 14, but might be located below the light shielding film 14. Therefore, when incident light from oblique directions increases, the components that cannot be gathered by the optical waveguides 17 might leak out of the optical waveguides 17, and the light sensitivity of the standard pixel 10 might become lower.

The present disclosure is made in view of those circumstances, and is to optimize the optical properties (pupil separation performance) of phase difference pixels, and the optical properties (light sensitivity) of standard pixels in a solid-state imaging device including the phase difference pixels.

Solutions to Problems

A solid-state imaging device of a first aspect of the present disclosure is a solid-state imaging device that includes a standard pixel and a phase difference pixel. The standard pixel includes a first optical waveguide that guides incident light to a light receiving region. The phase difference pixel includes: a second optical waveguide that guides incident light to the light receiving region; and a first light shielding film provided on the upper layer side of the second optical waveguide. The upper end of the first optical waveguide of the standard pixel and the upper end of the second optical waveguide of the phase difference pixel are located at different heights.

In the solid-state imaging device of the first aspect of the present disclosure, the standard pixel and the phase difference pixel may each further include a lens for gathering incident light on the light receiving region, the lenses having an identical shape. The shape of the lenses may be optimized for the standard pixel having the first optical waveguide.

The first light shielding film of the phase difference pixel may be located at the same height as the focal position of the lens, or be located on the upper layer side of the focal position.

An interconnect layer may serve as the first light shielding film of the phase difference pixel.

The first optical waveguide of the standard pixel may be formed in two separate stages, and the second optical waveguide of the phase difference pixel may be formed in the same stage as the first stage of the formation of the first optical waveguide of the standard pixel.

In the solid-state imaging device of the first aspect of the present disclosure, the phase difference pixel may further include a second light shielding film on the lower layer side of the second optical waveguide.

The solid-state imaging device may be of a surface-illuminated type.

The solid-state imaging device may be of a back-illuminated type.

The solid-state imaging device may be of a three-transistor type.

The solid-state imaging device may be of a four-transistor type.

The solid-state imaging device may be of a multi-pixel sharing type.

The solid-state imaging device may be of a stacked type.

An electronic apparatus of a second aspect of the present disclosure is an electronic apparatus that includes a solid-state imaging device, the solid-state imaging device including a standard pixel and a phase difference pixel. The standard pixel includes a first optical waveguide that guides incident light to a light receiving region. The phase difference pixel includes: a second optical waveguide that guides incident light to the light receiving region; and a first light shielding film provided on the upper layer side of the second optical waveguide. The upper end of the first optical waveguide of the standard pixel and the upper end of the second optical waveguide of the phase difference pixel are located at different heights.

Effects of the Invention

According to the first and second aspects of the present disclosure, the optical properties (pupil separation performance) of the phase difference pixel and the optical properties (light sensitivity) of the standard pixel can be optimized.

MODES FOR CARRYING OUT THE INVENTION

The following is a detailed description of best modes for carrying out the present disclosure (hereinafter referred to as embodiments), with reference to the drawings.

Example Structure of a Solid-State Imaging Device of this Embodiment

Figure 3:
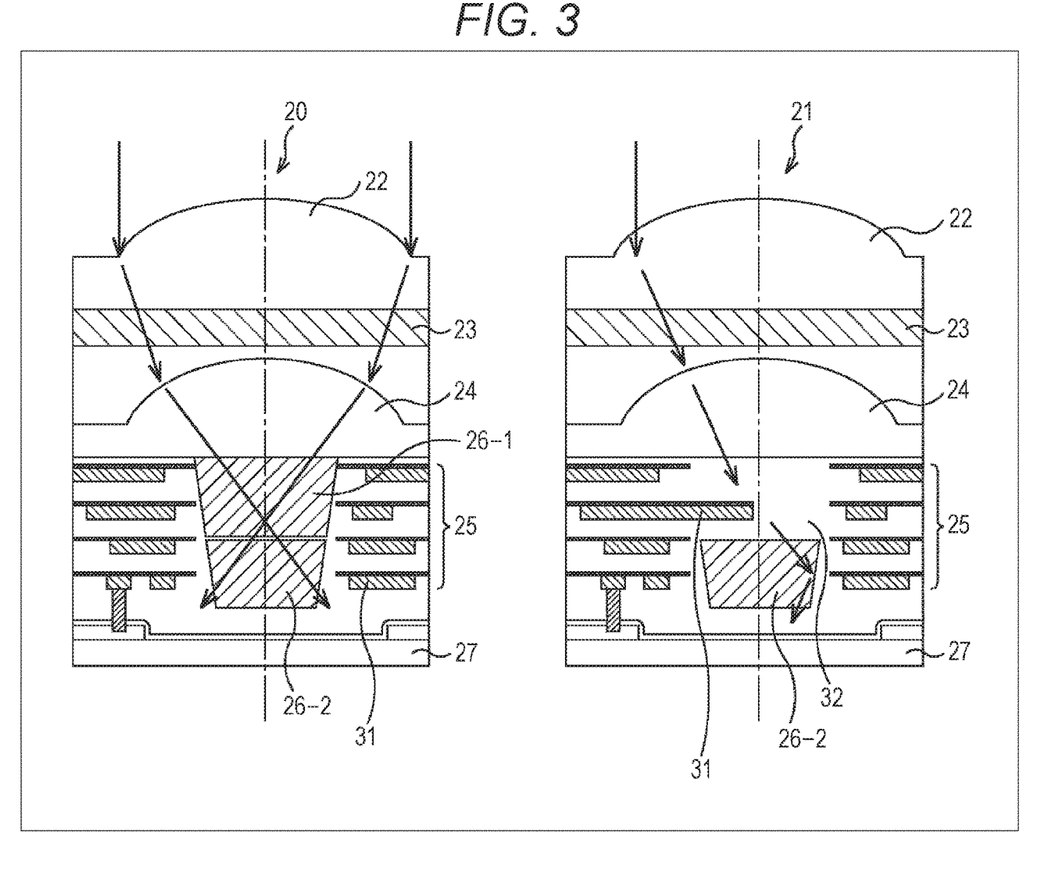
FIG. 3 is a cross-sectional diagram showing example structures of a standard pixel and a phase difference pixel of a solid-state imaging device to which the present disclosure is applied.

FIG. 3 is a cross-sectional view of an example structure of a solid-state imaging device of this embodiment including a phase difference pixel. In the drawing, the left side shows a standard pixel, and the right side shows a phase difference pixel.

In this solid-state imaging device, a standard pixel 20 and a phase difference pixel 21 each have an on-chip lens 22, a color filter 23, an inner lens 24, interconnect layers 25, and a light receiving region 27, in this order from the upper layer side (the light incidence surface side).

In the standard pixel 20, optical waveguides 26-1 through 26-2 are further provided from immediately below the inner lens 24 to a portion close to the light receiving region 27 on the lower layer side. In FIG. 3, a gap is drawn between the optical waveguide 26-1 and the optical waveguide 26-2 so as to clearly indicate the boundary between the two waveguides. In reality, however, the two waveguides are continuously formed without any gap.

In the standard pixel 20, the on-chip lens 22 and the inner lens 24 having the same shapes as those of the phase difference pixel 21 are designed so that the focal points thereof are formed in optimum positions in a state where the optical waveguides 26-1 and 26-2 are provided. Accordingly, the standard pixel 20 has optimum optical properties.

In the phase difference pixel 21, on the other hand, a light shielding film 31 that has an aperture portion 32 whose aperture is deviated from the optical axis of the on-chip lens 22 and the inner lens 24 is provided at the same height as or at a greater height than the optimum focal position of the on-chip lens 22 and the inner lens 24. The light shielding film 31 may serve as one layer of the multi-level interconnect layers 25, or a special-purpose layer may be provided as the light shielding film 31.

In the phase difference pixel 21, an optical waveguide 26-1 is further provided from immediately below the light shielding film 31 to a portion close to the light receiving region 27 on the lower layer side.

As the focal position of the on-chip lens 22 and the inner lens 24 is at the same height as the light shielding film 31, the phase difference pixel 21 has optimum pupil separation performance. Also, as the optical waveguide 26-1 is provided, the focusing properties with respect to the light receiving region 27 are improved.

Process of Manufacturing the Solid-State Imaging Device of this Embodiment

Figure 4:
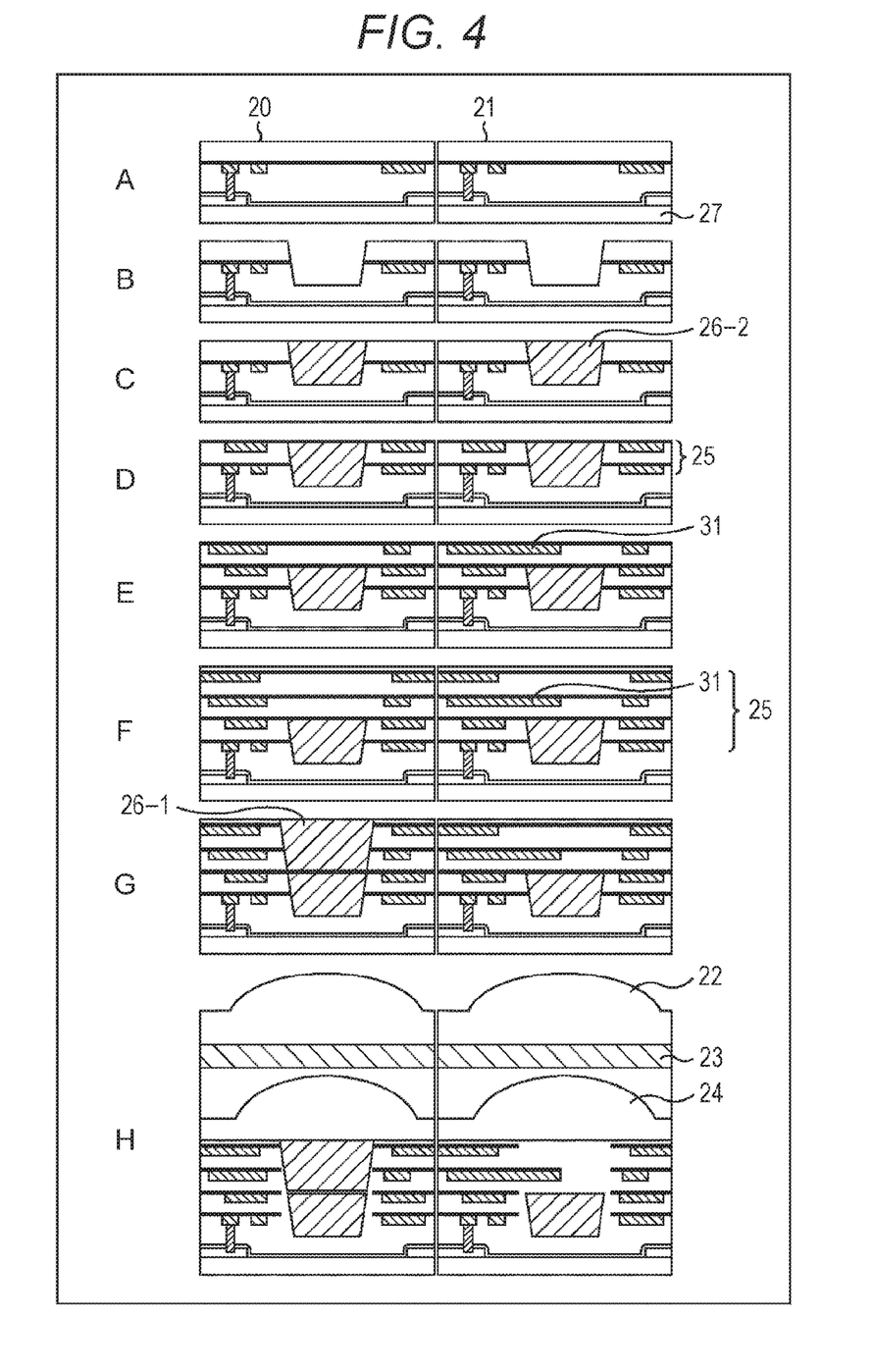
FIG. 4 is a diagram showing the process of manufacturing the solid-state imaging device to which the present disclosure is applied.

FIG. 4 shows a process of manufacturing the solid-state imaging device of this embodiment.

First, as shown in A in the drawing, an interconnect layer 25 as a common component between the standard pixel 10 and the phase difference pixel 11 is formed on the upper layer side of the light receiving region 27. As shown in B in the drawing, etching is performed on the portions of the interconnect layers 25 where the optical waveguides 26-2 are to be formed. As shown in C in the drawing, the etched portions are filled with a core material, to form the optical waveguides 26-2. SiON, SiN, or the like, which has a higher refractive index than the interlayer insulating film made of $SiO_2$ or the like, is used as the core material of the optical waveguide 26-2.

Further, as shown in D in the drawing, one interconnect layer 25 as a common component between the standard pixel 10 and the phase difference pixel 11 is formed at the same height as the upper ends of the optical waveguides 26-2. As shown in E and F in the drawing, interconnect layers 25 are further stacked thereon. At this point, as a component to be provided only in the phase difference pixel 11, only one of the interconnect layers 25 is formed to cover part of the upper side of the optical waveguide 26-2, so as to also serve as the light shielding film 31.

As a component to be provided only in the standard pixel 10, the optical waveguide 26-1 is then formed so as to join to the already formed optical waveguide 26-2, as shown in G in the drawing.

Lastly, as common components between the standard pixel 10 and the phase difference pixel 11, the inner lenses 24, the color filters 23, and the on-chip lenses 22 are formed, as shown in H in the drawing. The solid-state imaging device of this embodiment is completed through the above described process.

Optical Properties of the Solid-State Imaging Device of this Embodiment

Referring now to FIGS. 5 through 8, the optical properties of the phase difference pixel 21 of the solid-state imaging device of this embodiment are described.

Figure 5:
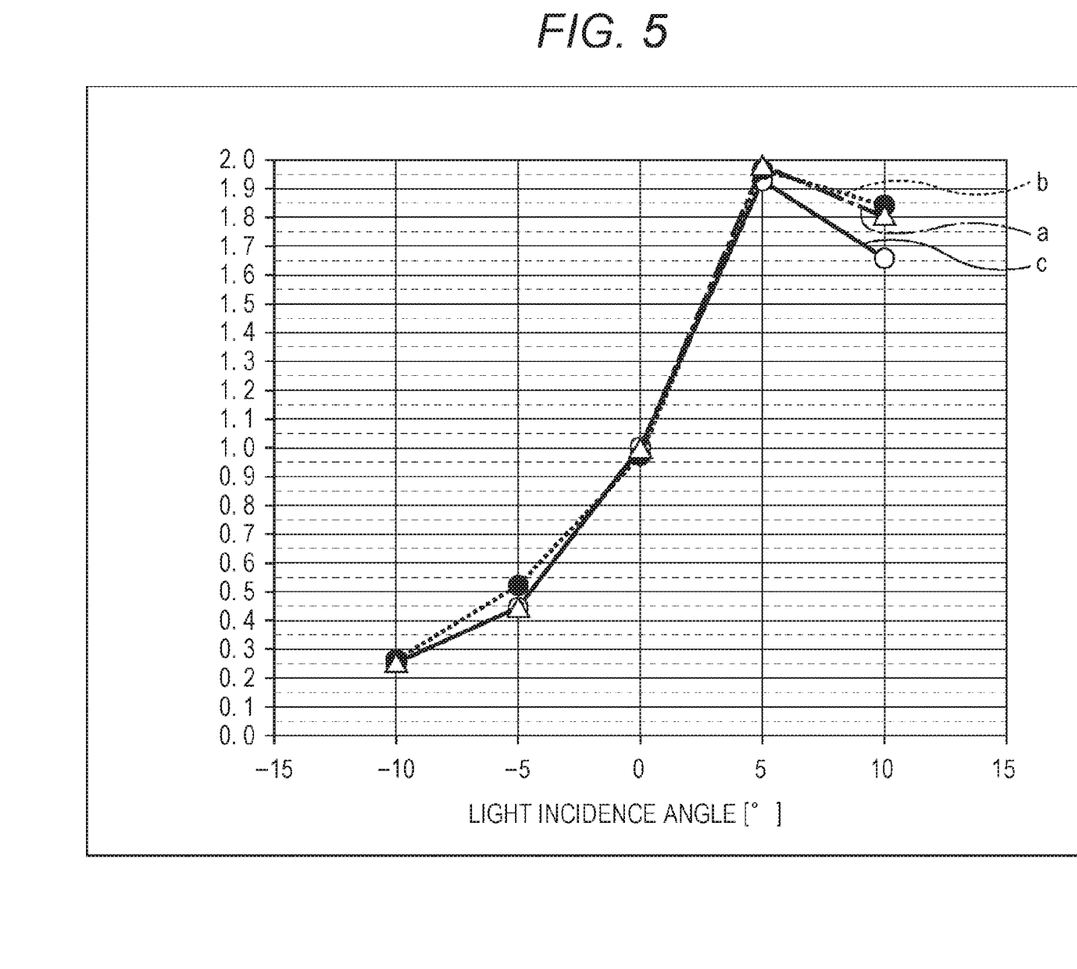
FIG. 5 is a diagram showing the result of a simulation performed on a phase difference pixel of the solid-state imaging device to which the present disclosure is applied.
Figure 6:
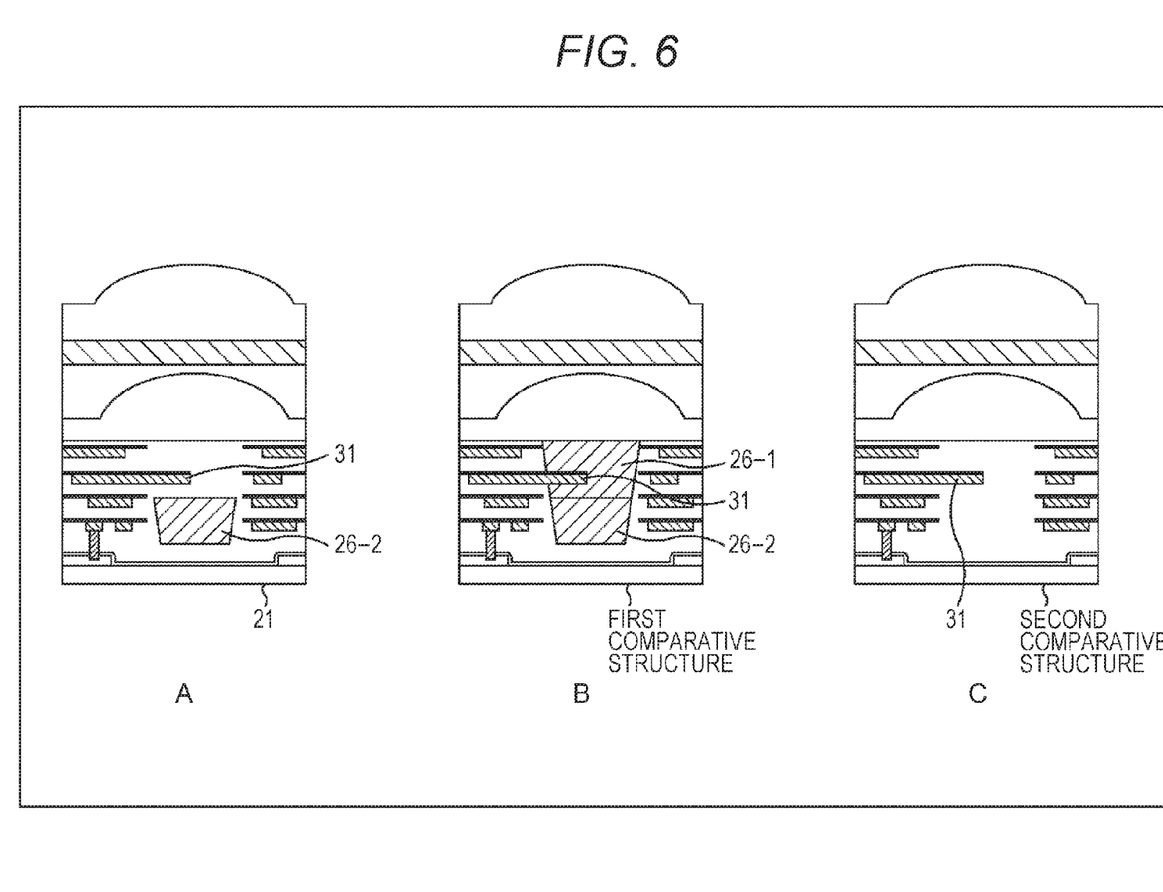
FIG. 6 is a diagram showing the phase difference pixel of the solid-state imaging device to which the present disclosure is applied, a first comparative structure, and a second comparative structure.

FIG. 5 shows the results of simulations performed to examine the light incidence angle and the light sensitivity of the phase difference pixel 21 (curve a). For comparison, FIG. 5 shows not only the result of the simulation performed on the phase difference pixel 21 shown in A in FIG. 6, but also the results of simulations performed on a first comparative structure (curve b) formed by adding an optical waveguide 26-1 to the phase difference pixel 21 as shown in B in FIG. 6, and a second comparative structure (curve c) formed by removing the optical waveguide 26-2 from the phase difference pixel 21 as shown in C in FIG. 6.

The abscissa axis in FIG. 5 indicates light incidence angles. It should be noted that a negative light incidence angle means that light enters the structure shown in FIG. 3 (the structure in which the aperture portion 32 of the light shielding film 31 is deviated from the optical axis to the right) from the right side. Meanwhile, a positive light incidence angle means that light enters the structure shown in FIG. 3 from the left side.

The ordinate axis in FIG. 5 indicates light sensitivities standardized where the result of the light sensitivity simulation performed on the second comparative structure at a light incidence angle of 0 degrees is the reference value of 1.0.

Figure 7:
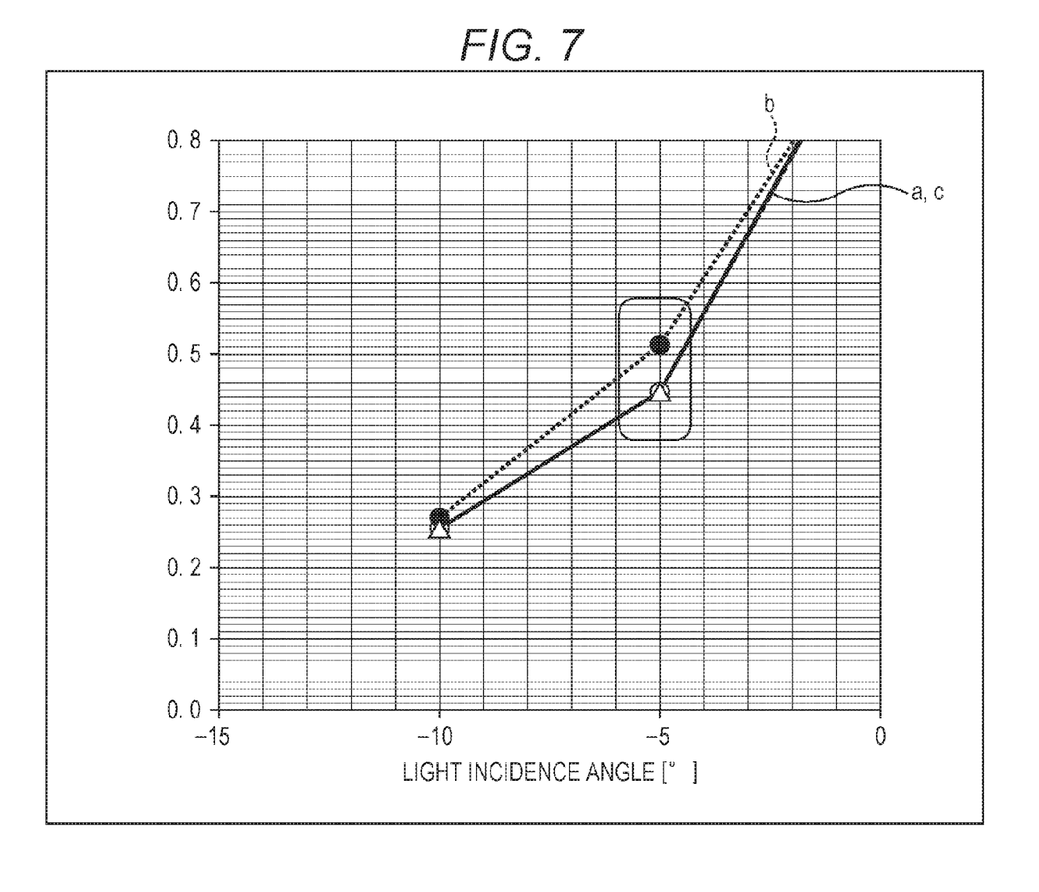
FIG. 7 is a diagram showing the result of the simulation performed on the phase difference pixel of the solid-state imaging device to which the present disclosure is applied.
Figure 8:
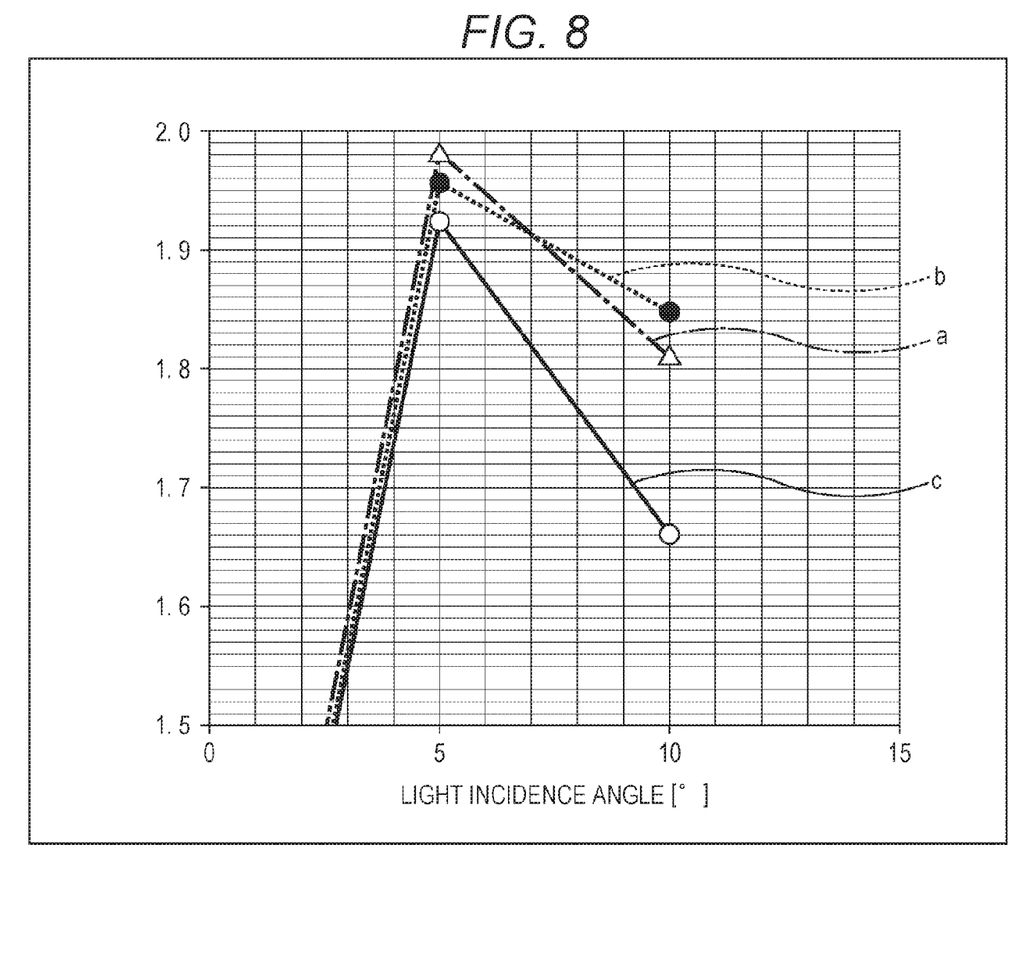
FIG. 8 is a diagram showing the result of the simulation performed on the phase difference pixel of the solid-state imaging device to which the present disclosure is applied.

FIG. 7 is an enlarged view of the portion in the neighborhood of the light incidence angle of −5 degrees in FIG. 5. FIG. 8 is an enlarged view of the portion in the neighborhood of the light incidence angle of +5 degrees in FIG. 5.

As shown in FIG. 7, when light enters from the right side in the first comparative structure indicated by the curve b, light reflected by the light shielding film is reflected by the optical waveguide located on the upper layer side of the light shielding film, and is gathered on the light receiving region. With this, the light sensitivity becomes higher, but the pupil separation performance is degraded. Therefore, it is apparent that the optical waveguide located on the upper layer side of the light shielding film causes degradation in the separation performance.

As shown in FIG. 8, when light enters from the left side in the second comparative structure indicated by the curve c, the focusing properties are poor, since there are no optical waveguides provided therein.

As can be seen from the above simulation results, the phase difference pixel 21 of this embodiment indicated by the curve a has the best-balanced pupil separation performance.

Other Example Structures of Solid-State Imaging Devices of this Embodiment

Figure 9:
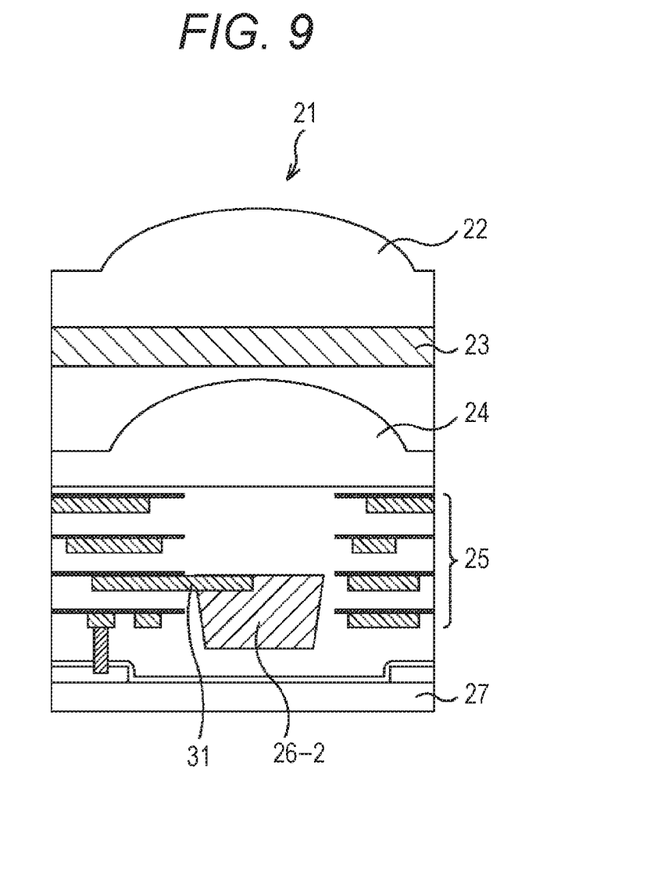
FIG. 9 is a cross-sectional diagram showing another example structure of a phase difference pixel of a solid-state imaging device to which the present disclosure is applied.

FIG. 9 is a cross-sectional view of another example structure (first modification) of a solid-state imaging device of this embodiment including a phase difference pixel. In this drawing, any standard pixel 20 is not shown, and only a phase difference pixel 21 is shown.

The first modification shown in FIG. 9 is the same as the example structure shown in FIG. 3, except that the light shielding film 31 is formed at the same height as the upper end of the optical waveguide 26-2.

With the first modification, the same optical properties as those of the example structure shown in FIG. 3 can be achieved.

Figure 10:
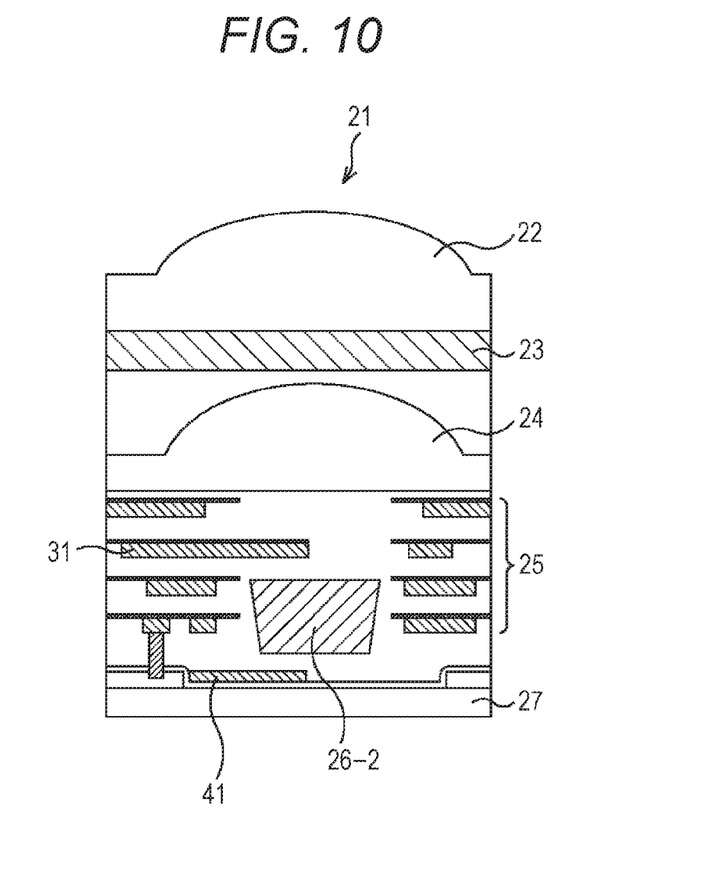
FIG. 10 is a cross-sectional diagram showing yet another example structure of a phase difference pixel of a solid-state imaging device to which the present disclosure is applied.

FIG. 10 is a cross-sectional view of yet another example structure (second modification) of a solid-state imaging device of this embodiment including a phase difference pixel. In this drawing, any standard pixel 20 is not shown, and only a phase difference pixel 21 is shown.

The second modification shown in FIG. 10 is the same as the example structure shown in FIG. 3, except that a light shielding film 41 is additionally provided on the lower layer side of the optical waveguide 26-2 located immediately below the light shielding film 31. The light shielding film 41 is made of a metallic material such as W, Ti, or TiN. The light shielding film 41 may also be added to the first modification shown in FIG. 9.

In the second modification, the small leak of light at a time when light enters from the right side can be reduced. Also, as the optical center moves outward when light enters from the left side, degradation of the light sensitivity does not become a problem. Accordingly, in the second modification, higher overall separation performance can be expected.

Example Application of the Solid-State Imaging Device of this Embodiment

Although the solid-state imaging devices of this embodiment described so far with reference to the drawings are of a surface-illuminated type, the present disclosure can also be applied to solid-state imaging devices of a back-illuminated type.

Also, a solid-state imaging device of this embodiment can be used in both a three-transistor CMOS image sensor and a four-transistor CMOS image sensor.

Figure 11:
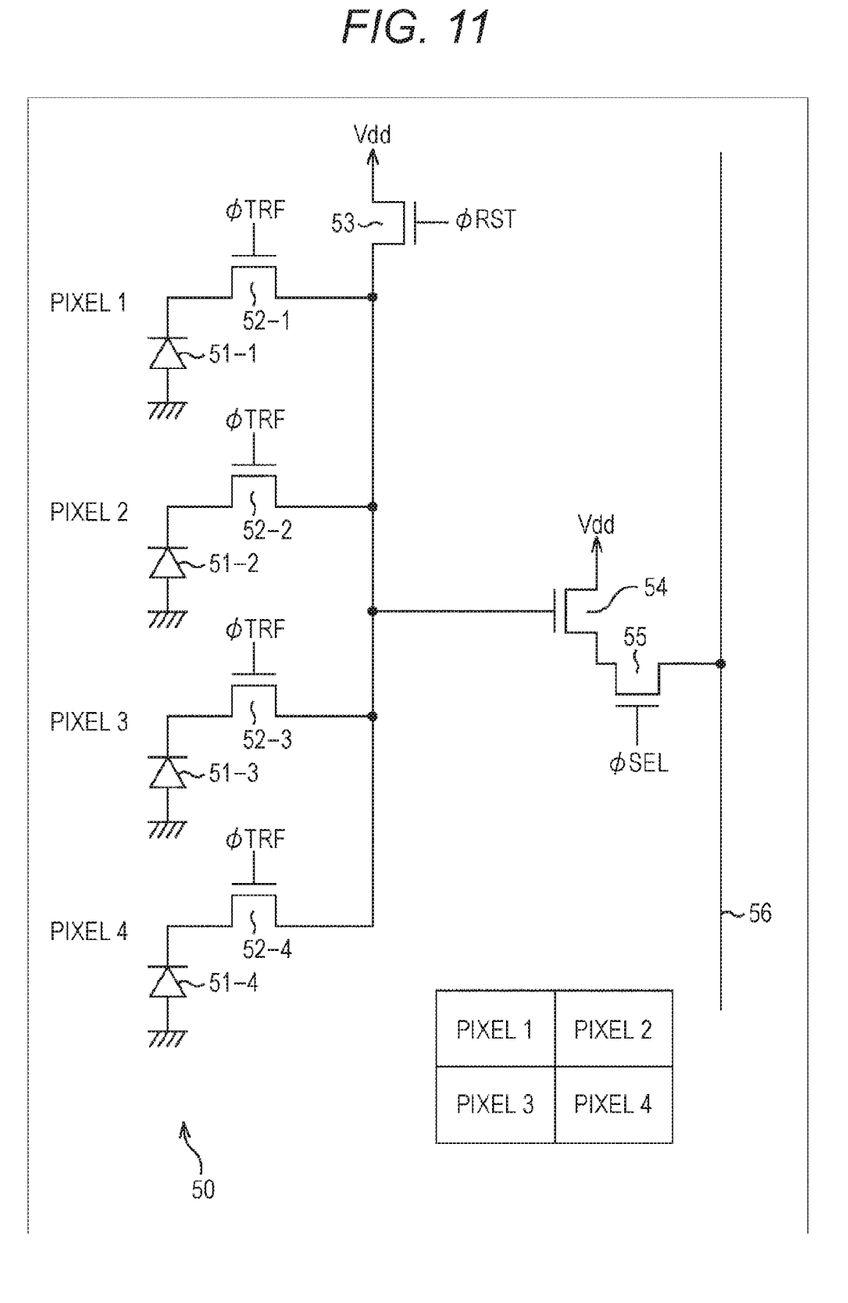
FIG. 11 is a circuit diagram showing an example structure of a four-pixel sharing CMOS image sensor.

Further, a solid-state imaging device of this embodiment can be used in a CMOS image sensor in which an FD is shared among pixels, such as a four-pixel sharing CMOS image sensor 50 shown in FIG. 11.

Figure 12:
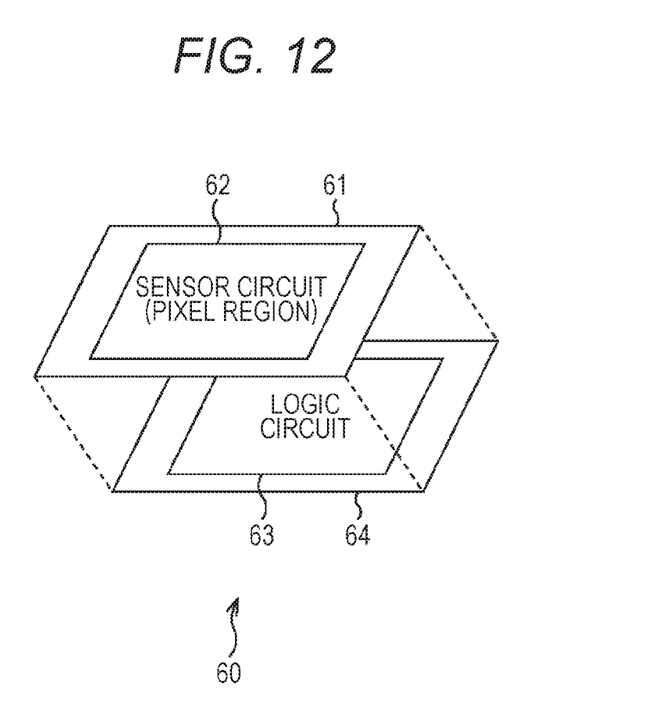
FIG. 12 is a block diagram showing an example structure of a stacked CMOS image sensor.

Furthermore, a solid-state imaging device of this embodiment can be applied to a stacked CMOS image sensor 60 in which a substrate 61 having a sensor circuit 62 formed therein and a substrate 64 having a logic circuit 63 formed therein are stacked, as shown in FIG. 12, for example.

A solid-state imaging device of this embodiment can be applied not only to imaging apparatuses but also to any kind of electronic apparatus that has an imaging function.

It should be noted that embodiments of the present disclosure are not limited to the above described embodiment, and various modifications may be made to the above embodiment without departing from the scope of the present disclosure.

The present disclosure can also be embodied in the structures described below.

(1)
A solid-state imaging device including
a standard pixel and a phase difference pixel,
wherein
the standard pixel includes
a first optical waveguide that guides incident light to a light receiving region,
the phase difference pixel includes:
a second optical waveguide that guides incident light to the light receiving region; and
a first light shielding film provided on the upper layer side of the second optical waveguide, and
the upper end of the first optical waveguide of the standard pixel and the upper end of the second optical waveguide of the phase difference pixel are located at different heights.

(2)
The solid-state imaging device of (1), wherein
the standard pixel and the phase difference pixel each further include a lens for gathering incident light on the light receiving region, the lenses having an identical shape, and
the shape of the lenses is optimized for the standard pixel having the first optical waveguide.

(3)
The solid-state imaging device of (2), wherein the first light shielding film of the phase difference pixel is located at the same height as the focal position of the lens, or is located on the upper layer side of the focal position.

(4)
The solid-state imaging device of any of (1) through (3), wherein an interconnect layer serves as the first light shielding film of the phase difference pixel.

(5)
The solid-state imaging device of any of (1) through (4), wherein
the first optical waveguide of the standard pixel is formed in two separate stages, and
the second optical waveguide of the phase difference pixel is formed in the same stage as the first stage of the formation of the first optical waveguide of the standard pixel.

(6)
The solid-state imaging device of any of (1) through (5), wherein the phase difference pixel further includes a second light shielding film on the lower layer side of the second optical waveguide.

(7)
The solid-state imaging device of any of (1) through (6), which is of a surface-illuminated type.

(8)
The solid-state imaging device of any of (1) through (6), which is of a back-illuminated type.

(9)
The solid-state imaging device of any of (1) through (8), which is of a three-transistor type.

(10)
The solid-state imaging device of any of (1) through (8), which is of a four-transistor type.

(11)
The solid-state imaging device of any of (1) through (10), which is of a multi-pixel sharing type.

(12)
The solid-state imaging device of any of (1) through (11), which is of a stacked type.

(13)
An electronic apparatus including
a solid-state imaging device,
the solid-state imaging device including
a standard pixel and a phase difference pixel,
wherein
the standard pixel includes
a first optical waveguide that guides incident light to a light receiving region,
the phase difference pixel includes:
a second optical waveguide that guides incident light to the light receiving region; and
a first light shielding film provided on the upper layer side of the second optical waveguide, and
the upper end of the first optical waveguide of the standard pixel and the upper end of the second optical waveguide of the phase difference pixel are located at different heights.

REFERENCE SIGNS LIST

20 Standard pixel
21 Phase difference pixel
22 On-chip lens
23 Color filter
24 Inner lens
25 Interconnect layer
26 Optical waveguide
27 Light receiving region
31 Light shielding film
32 Aperture portion
41 Light shielding film
50 Four-pixel sharing CMOS image sensor
60 Stacked CMOS image sensor

The invention claimed is:
1. A solid-state imaging device comprising
a standard pixel and a phase difference pixel,
wherein
the standard pixel includes
a first optical waveguide configured to guide incident light to a light receiving region,
the phase difference pixel includes:
a second optical waveguide configured to guide incident light to the light receiving region; and
a first light shielding film provided on an upper layer side of the second optical waveguide, and
an upper end of the first optical waveguide of the standard pixel and an upper end of the second optical waveguide of the phase difference pixel are located at different heights.

2. The solid-state imaging device according to claim 1, wherein
the standard pixel and the phase difference pixel each further include a lens for gathering incident light on the light receiving region, the lenses having an identical shape, and
the shape of the lenses is optimized for the standard pixel having the first optical waveguide.

3. The solid-state imaging device according to claim 2, wherein the first light shielding film of the phase difference pixel is located at the same height as a focal position of the lens, or is located on an upper layer side of the focal position.

4. The solid-state imaging device according to claim 2, wherein
an interconnect layer serves as the first light shielding film of the phase difference pixel.

5. The solid-state imaging device according to claim 2, wherein
the first optical waveguide of the standard pixel is formed in two separate stages, and
the second optical waveguide of the phase difference pixel is formed in the same stage as the first stage of the formation of the first optical waveguide of the standard pixel.

6. The solid-state imaging device according to claim 2, wherein
the phase difference pixel further includes a second light shielding film on a lower layer side of the second optical waveguide.

7. The solid-state imaging device according to claim 2, which is of a surface-illuminated type.

8. The solid-state imaging device according to claim 2, which is of a back-illuminated type.

9. The solid-state imaging device according to claim 2, which is of a three-transistor type.

10. The solid-state imaging device according to claim 2, which is of a four-transistor type.

11. The solid-state imaging device according to claim 2, which is of a multi-pixel sharing type.

12. The solid-state imaging device according to claim 2, which is of a stacked type.

13. An electronic apparatus comprising
a solid-state imaging device,
the solid-state imaging device including
a standard pixel and a phase difference pixel,
wherein
the standard pixel includes
a first optical waveguide that guides incident light to a light receiving region,
the phase difference pixel includes:
a second optical waveguide that guides incident light to the light receiving region; and
a first light shielding film provided on an upper layer side of the second optical waveguide, and
an upper end of the first optical waveguide of the standard pixel and an upper end of the second optical waveguide of the phase difference pixel are located at different heights.

* * * * *